United States Patent
Okuyama (10) Patent No.: US 7,557,648 B2
(45) Date of Patent: Jul. 7, 2009

(54) OPERATIONAL AMPLIFIER, INTEGRATING CIRCUIT, FEEDBACK AMPLIFIER, AND CONTROLLING METHOD OF THE FEEDBACK AMPLIFIER

(75) Inventor: Kuniyuki Okuyama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 253 days.

(21) Appl. No.: 11/589,238

(22) Filed: Oct. 30, 2006

(65) Prior Publication Data

US 2007/0096825 A1    May 3, 2007

(30) Foreign Application Priority Data

Oct. 31, 2005    (JP)    ............... 2005-316483

(51) Int. Cl.
*H03F 7/00*    (2006.01)
(52) U.S. Cl. ............... 330/9; 330/302; 330/305
(58) Field of Classification Search ............ 330/9, 330/302, 303, 305, 306; 327/337
See application file for complete search history.

(56) References Cited

U.S. PATENT DOCUMENTS 6,275,095 B1    8/2001    Hoshino et al.

FOREIGN PATENT DOCUMENTS

| JP | 04-239208 | 8/1992 |
|----|-----------|--------|
| JP | 06-164263 | 6/1994 |
| JP | 9-331482 | 12/1997 |
| JP | 2000-165161 A | 6/2000 |
| JP | 2000-200845 A | 7/2000 |
| JP | 2000-516075 A | 11/2000 |
| JP | 2004-072681 A | 3/2004 |

*Primary Examiner*—Michael B Shingleton
(74) *Attorney, Agent, or Firm*—Foley & Lardner LLP (57) ABSTRACT

An operational amplifier according to an embodiment of the present invention includes: an operational amplifier stage executing differential-amplification of an input voltage and a reference voltage; a source-grounded amplifier stage outputting the differential-amplified signal; a phase compensation capacitance compensating for a phase of an output signal; and a charge/discharge control circuit controlling charge/discharge of the phase compensation capacitance.

19 Claims, 9 Drawing Sheets

PRIOR ART

Fig. 8

PRIOR ART

OPERATIONAL AMPLIFIER, INTEGRATING CIRCUIT, FEEDBACK AMPLIFIER, AND CONTROLLING METHOD OF THE FEEDBACK AMPLIFIER

BACKGROUND OF THE INVENTION

1. Field of the Invention

The present invention relates to an operational amplifier and an integrating circuit, and more particularly to an operational amplifier including a phase compensation capacitance, and an integral action.

2. Description of Related Art

Hitherto, there have been widely known integrating circuits outputting a signal representing a result of integrating current or voltage values of an input signal. Such integrating circuits operate while repeating an integration period in which charges are accumulated in a capacitor element (charging) and a reset period in which charges are released from the capacitor element (discharging). As signals are amplified by the integrating circuit, input noise components are amplified together with input signal components. However, it is possible to reduce input noise components by narrowing a bandwidth of the integrating circuit. In order to narrower a bandwidth of the integrating circuit driven with a predetermined period, it is necessary to shorten the reset period and lengthen the integration period.

A reset operation of the integrating circuit using an operational amplifier varies depending on a slew rate. The slew rate means a rate of change of an output signal on the rising or falling edge thereof. For increasing the slew rate to shorten the reset period, it is necessary to increase current consumption of the operational amplifier or reduce a phase compensation capacitance of the operational amplifier. The phase compensation capacitance is traded off for a circuit stability of the operational amplifier. Hence, in general, current consumption is increased, and the reset period is shortened.

Figure 8:
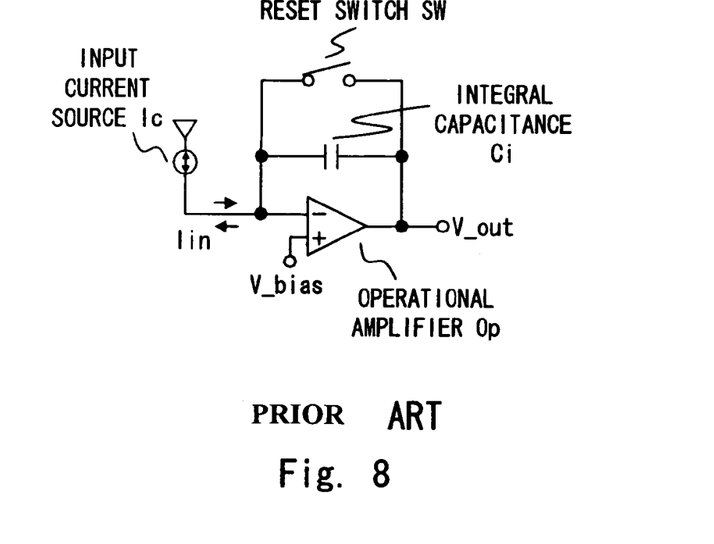
FIG. 8 is a schematic circuit diagram showing the configuration of a conventional integrating circuit.

FIG. 8 is a schematic diagram of a conventional integrating circuit using an operational amplifier. As shown in FIG. 8, the integrating circuit includes an operational amplifier Op, an input current source Ic, a reset switch SW, and an integral capacitance Ci. The operational amplifier Op has a non-inverting input terminal (positive terminal) applied with a reference voltage V_bias and an inverting input terminal (negative terminal) supplied with an input current Iin from an input current source Ic. Further, an integral capacitance Ci and a reset switch SW are connected in parallel between the inverting input terminal and the output terminal of the operational amplifier Op. The integral capacitance Ci is charged/discharged by use of the current Iin from the input current source Ic. The integral of a voltage changed through the charging/discharging is evaluated and output from the output terminal as an output voltage V_out.

Figure 9:
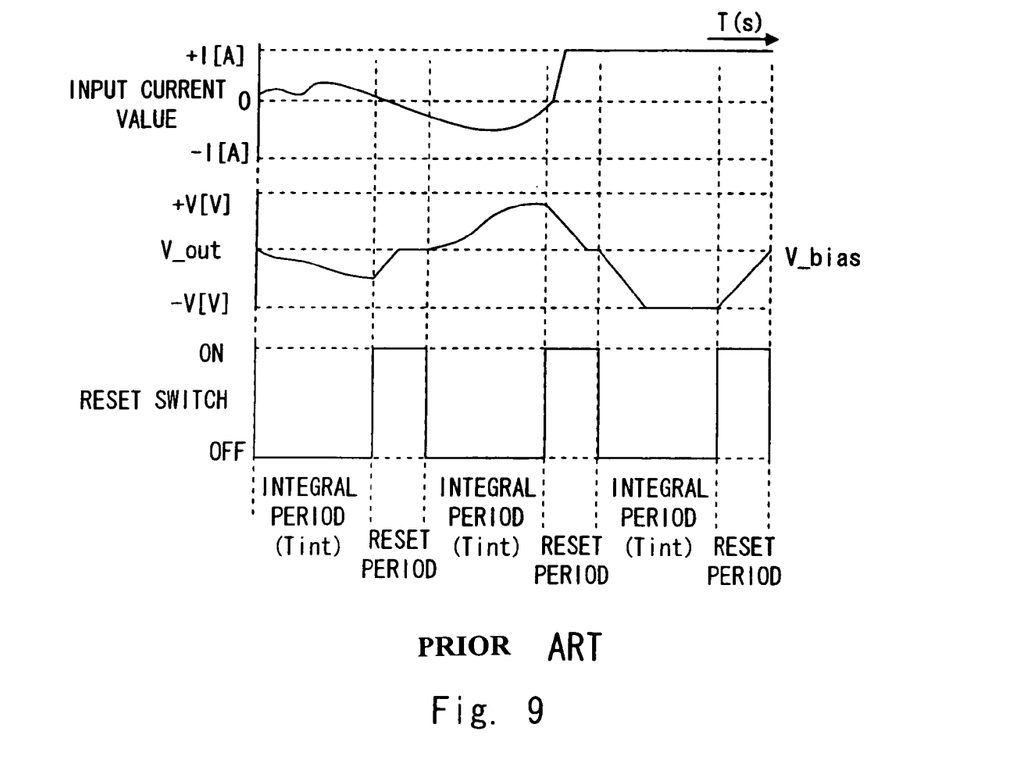
FIG. 9 is a timing chart of operations of the conventional integrating circuit.

FIG. 9 is a timing chart of the conventional integrating circuit using an operational amplifier, which shows an operation of the integrating circuit of FIG. 8. The operational amplifier Op is applied with a reference voltage V_bias at a predetermined voltage level, and an analog input current or digital input current Iin that varies between a high level (+I) and a low level (−I). The reset switch SW is set to be turned ON for a predetermined period, at predetermined intervals.

An OFF period of the reset switch SW is an integration period over which a voltage changed through the charging/discharging of the integral capacitance Ci is integrated. Further, an ON period of the reset switch SW is a reset period in which the integrated voltage is reset to a reference voltage V_bias. During the integration period, the reset switch SW is turned OFF, and charges are accumulated/released to/from the integral capacitance Ci due to the input current Iin. As a result, the output voltage V_out is changed from the reference voltage V bias to a higher level (+V) or lower level (−V). During the reset period, the reset switch is turned ON, and charges are accumulated/released to/from the integral capacitance Ci. As a result, the output voltage V_out is changed from a high or low level to the reference voltage V_bias.

Figure 10:
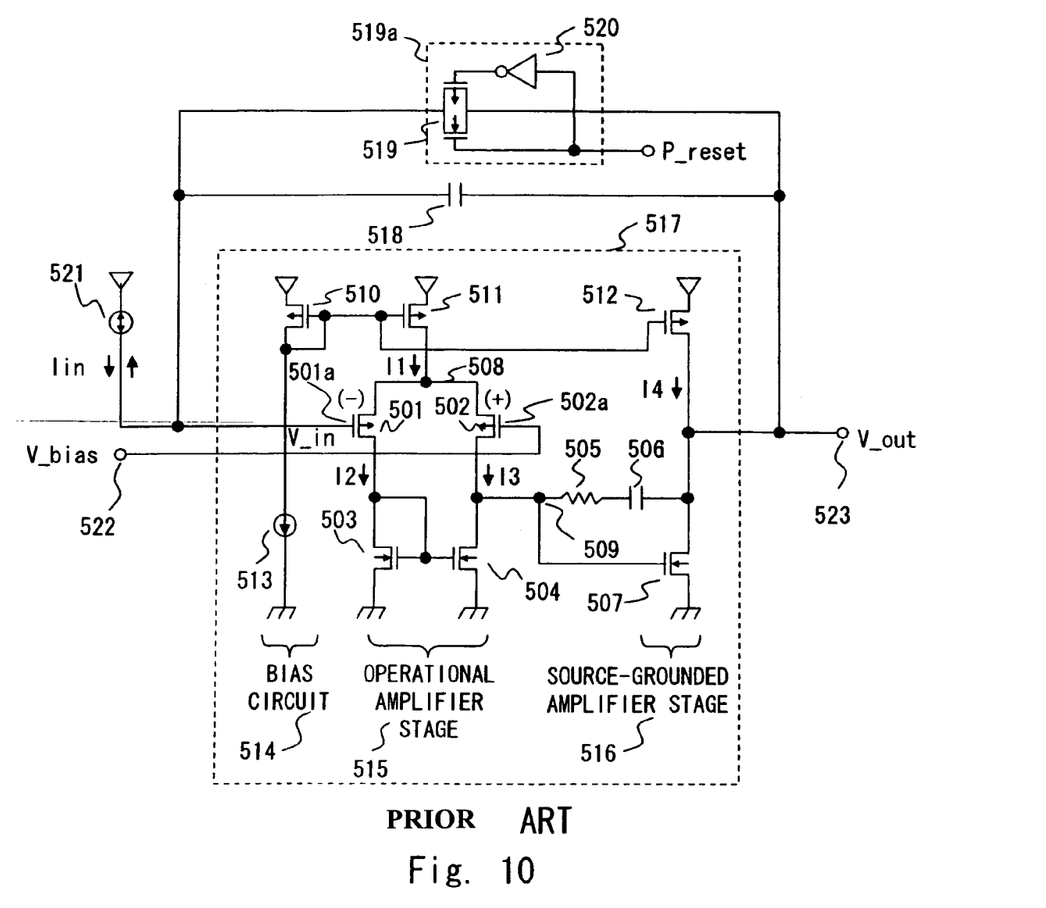
FIG. 10 is a detailed circuit diagram showing the configuration of the conventional integrating circuit.

FIG. 10 is a circuit diagram showing the detailed configuration of the conventional integrating circuit shown in the schematic diagram of FIG. 8. To describe correspondences between FIGS. 8 and 10, in FIG. 10, reference numeral 517 denotes an operational amplifier Op; 518, an integral capacitance Ci; 519a, a reset switch SW; and 521, an input current source Ic.

The operational amplifier 517 is composed of a bias circuit 514, an operational amplifier stage 515, and a source-grounded amplifier stage 516. Moreover, an operational amplifier 517 additionally includes a phase compensation resistor 505, and a phase compensation capacitance 506 for preventing oscillation. In order to carry out an integral operation with the operational amplifier 517, an input current source 521, an integral capacitance 518, and a reset switch 519a are added to the operational amplifier 517. As shown in FIG. 9, the input current source 521 outputs a forward or reverse current Iin. The reset switch 519a is turned ON/OFF by means of a transfer gate 519 and an inverter 520 at a timing of FIG. 9.

The bias circuit 514 supplies constant current to a P-type MOSFET 510 from a constant current source 513. A current mirror circuit of the P-type MOSFET 510, a P-type MOSFET 511, and a P-type MOSFET 512 supplies the current I1 to the operational amplifier stage 515, and supplies a current I4 to the source-grounded amplifier stage 516. The operational amplifier stage 515 has a non-inverting input node 502a (positive node) applied with the reference voltage V_bias, and an inverting input node 501a (negative node) supplied with an input current Iin. The operational amplifier stage 515 executes differential amplification by a differential pair of P-type MOSFETs 501 and 502, and a current mirror circuit of N-type MOSFETs 503 and 504. In the source-grounded amplifier stage 516, a drain current of the N-type MOSFET 507 is changed in accordance with a voltage of a node 509 as an output terminal of the operational amplifier stage 515, and an output voltage V_out is changed.

In the integration period of FIG. 9, if the input current Iin flows to the full from the input current source 521 in the forward direction, the input current Iin charges the integral capacitance 518. As a result, reference voltage V_bias<<input voltage V_in, so all of the current I1 flows through the P-type MOSFET 502. Accordingly, the current I1 flows from the P-type MOSFET 502 to the phase compensation capacitance 506, and charges of the phase compensation capacitance 506 are released. In contrast, if the input current Iin flows to the full in the reverse direction, charges of the integral capacitance 518 are released due to the input current Iin. As a result, reference voltage V_bias>>input voltage V_in, so all the current I1 flows through the P-type MOSFET 501. Accordingly, a current flows from the phase compensation capacitance 506 to the N-type MOSFET 504 to thereby charge the phase compensation capacitance 506. As a result of charging/discharging the phase compensation capacitance 506, the output voltage V_out is changed.

In the reset period of FIG. 9, the reset switch 519a is turned ON, the integral capacitance 518 is being charged, and the phase compensation capacitance 506 is being charged/discharged to reset the output voltage V_out to reference voltage V_bias. If the output voltage V_out is lower than the reference voltage V_bias just before the reset operation, a current flows from the phase compensation capacitance 506 to the N-type MOSFET 504 to thereby charge the phase compensation capacitance 506 through the reset operation as described above. As a result, the output voltage V_out is changed from the low level to the reference voltage V_bias. Further, if the output voltage V_out is higher than the reference voltage V_bias just before the reset operation, current flows from the P-type MOSFET 502 to the phase compensation capacitance 506 through the reset operation to thereby discharge the phase compensation capacitance 506 as described above. As a result, the output voltage V_out is changed from the high level to the reference voltage V_bias.

If the current Iin flows to the full in the integration period, and in the reset period, under the condition of $I4 \geq I1$, a change rate of the output voltage V_out (slew rate)=current $I1$/phase compensation capacitance 506. The slew rate is determined based on the phase compensation capacitance 506 and the current $I1$ of the operational amplifier stage 515 ($I4 \geq I1$).

Incidentally, Japanese Unexamined Patent Publication No. 9-331482 and Japanese Patent Translation Publication No. 2000-516075 disclose a conventional integrating circuit using an operational amplifier.

In general, in the integrating circuit, if the reset period may be shortened in a predetermined period, for example, in the case where the bandwidth is narrowed to reduce the input noise components. In this case, it is necessary to execute the reset operation with reliability within a short reset period, so the slew rate of the operational amplifier should be increased in accordance with the short reset period. As described above, the slew rate is determined based on a current value of the operational amplifier stage and the phase compensation capacitance. Therefore, in order to increase the slew rate, it is necessary to increase a current value of the operational amplifier stage or reduce the phase compensation capacitance value.

On the other hand, a large integral capacitance becomes a load for the operational amplifier. Thus, in order to ensure circuit stability, a large phase compensation capacitance value is necessary. This is because, if the phase compensation capacitance value is increased, a first pole frequency $\omega p1$ is lowered, and a phase margin as an index of circuit stability can be ensured.

As discussed above, a large phase compensation capacitance is necessary for the circuit stability. However, if the phase compensation capacitance is increased, the slew rate is lowered. Hence, in order to increase the slew rate, it is necessary to increase a current value of a differential input stage, resulting in a problem in that current consumption of the operational amplifier increases.

SUMMARY OF THE INVENTION

An operational amplifier according to an aspect of the present invention includes: an operational amplifier circuit (for example, operational amplifier stage 122 of FIG. 1) differential-amplifying an input signal with reference to a reference potential; an output circuit (for example, source-grounded amplifier stage 123 of FIG. 1) outputting the differential-amplified signal; a phase compensation capacitance (for example, phase compensation capacitance 106 of FIG. 1) connected between an output of the operational amplifier circuit and an output of the output circuit and compensating for a phase of a signal output from the output circuit; and a charge/discharge control circuit (for example, charge/discharge control circuit 125 of FIG. 1) controlling charge/discharge of the phase compensation capacitance. According to the operational amplifier, the charge/discharge control circuit controls charge/discharge of the phase compensation capacitance, so a reset operation can be carried out at higher speeds than a slew rate determined by a current value of the operational amplifier (for example, current $I1$ of FIG. 1) and the phase compensation capacitance.

Further, an integrating circuit according to another aspect of the invention includes: an operational amplifier (for example, operational amplifier 120 of FIG. 1); an integral capacitance parallel-connected with the operational amplifier (for example, integral capacitance 131 of FIG. 1); and a reset switch (for example, reset switch 132*a* of FIG. 1) parallel-connected with the integral capacitance, the operational amplifier including: an operational amplifier circuit (for example, operational amplifier stage 122 of FIG. 1) differential-amplifying an input signal with reference to a reference potential; an output circuit (for example, source-grounded amplifier stage 123 of FIG. 1) outputting the differential-amplified signal; a phase compensation capacitance (for example, phase compensation capacitance 106 of FIG. 1) connected between an output of the operational amplifier circuit and an output of the output circuit and compensating for a phase of a signal output from the output circuit; and a charge/discharge control circuit (for example, charge/discharge control circuit 125 of FIG. 1) controlling charge/discharge of the phase compensation capacitance. According to the integrating circuit, the charge/discharge control circuit of the operational amplifier controls charge/discharge of the phase compensation capacitance in a reset period (for example, periods B, E, and H of FIG. 2), so a current value (for example, current $I1$ of FIG. 1) and the phase compensation capacitance value as a parameter for determining a slew rate of the operational amplifier can be optimized in accordance with operations in the integration period (for example, periods A, D, G, and J of FIG. 2), and a high-speed reset operation can be realized with the operational amplifier of low current consumption.

Further, a feedback amplifier according to another embodiment of the invention includes: an operational amplifier (of FIG. 1 for example, operational amplifier 120); a feedback element (for example, integral capacitance 131 of FIG. 1) parallel-connected with the operational amplifier; and a reset switch (for example, reset switch 132*a* of FIG. 1) parallel-connected with the feedback element, the operational amplifier including: an operational amplifier circuit (for example, operational amplifier stage 122 of FIG. 1) differential-amplifying an input signal with reference to a reference potential; an output circuit (for example, source-grounded amplifier stage 123 of FIG. 1) outputting the differential-amplified signal; a phase compensation capacitance (for example, phase compensation capacitance 106 of FIG. 1) connected between an output of the operational amplifier circuit and an output of the output circuit and compensating for a phase of a signal output from the output circuit; and a charge/discharge control circuit (for example, charge/discharge control circuit 125 of FIG. 1) controlling charge/discharge of the phase compensation capacitance. According to the feedback amplifier, the charge/discharge control circuit of the operational amplifier controls charge/discharge of the phase compensation capacitance in a reset period (for example, periods B, E, and H of FIG. 2), so a current value (for example, current $I1$ of FIG. 1) and the phase compensation capacitance value as a parameter for determining a slew rate of the operational amplifier can be optimized in accordance with operations in the integration period (for example, periods A, D, G, and J of FIG. 2), and a high-speed reset operation can be realized with the operational amplifier of low current consumption.

Further, according to another aspect of the invention, a controlling method of a feedback amplifier including: an operational amplifier (for example, operational amplifier 120 of FIG. 1); a feedback element (for example, integral capacitance 131 of FIG. 1) parallel-connected with the operational amplifier; and a reset switch (for example, reset switch 132a of FIG. 1) parallel-connected with the feedback element, includes: turning off the reset switch in a sampling period where an input signal is sampled with the feedback element; and turning on the reset switch and changing a potential at both ends or one end of the phase compensation capacitance to cause a predetermined potential difference between both the ends of the phase compensation capacitance to charge/discharge the phase compensation capacitance in a reset period where the feedback element is reset. According to the controlling method of a feedback amplifier, charge/discharge of the phase compensation capacitance in a reset period (for example, periods B, E, and H of FIG. 2) is controlled, so a current value (for example, current I1 of FIG. 1) and the phase compensation capacitance value as a parameter for determining a slew rate of the operational amplifier can be optimized in accordance with operations in a sampling period (for example, periods A, D, G, and J of FIG. 2), and a high-speed reset operation can be realized with the operational amplifier of low current consumption.

According to the present invention, it is possible to realize high-speed reset operations of an operational amplifier and a circuit including an operational amplifier, and save power consumption thereof.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

To begin with, an integrating circuit according to a first embodiment of the present invention is described. A feature of the integrating circuit of this embodiment is to additionally provide a charge/discharge switch controlling charging/discharging of a phase compensation capacitance from the outside of an operational amplifier.

Figure 1:
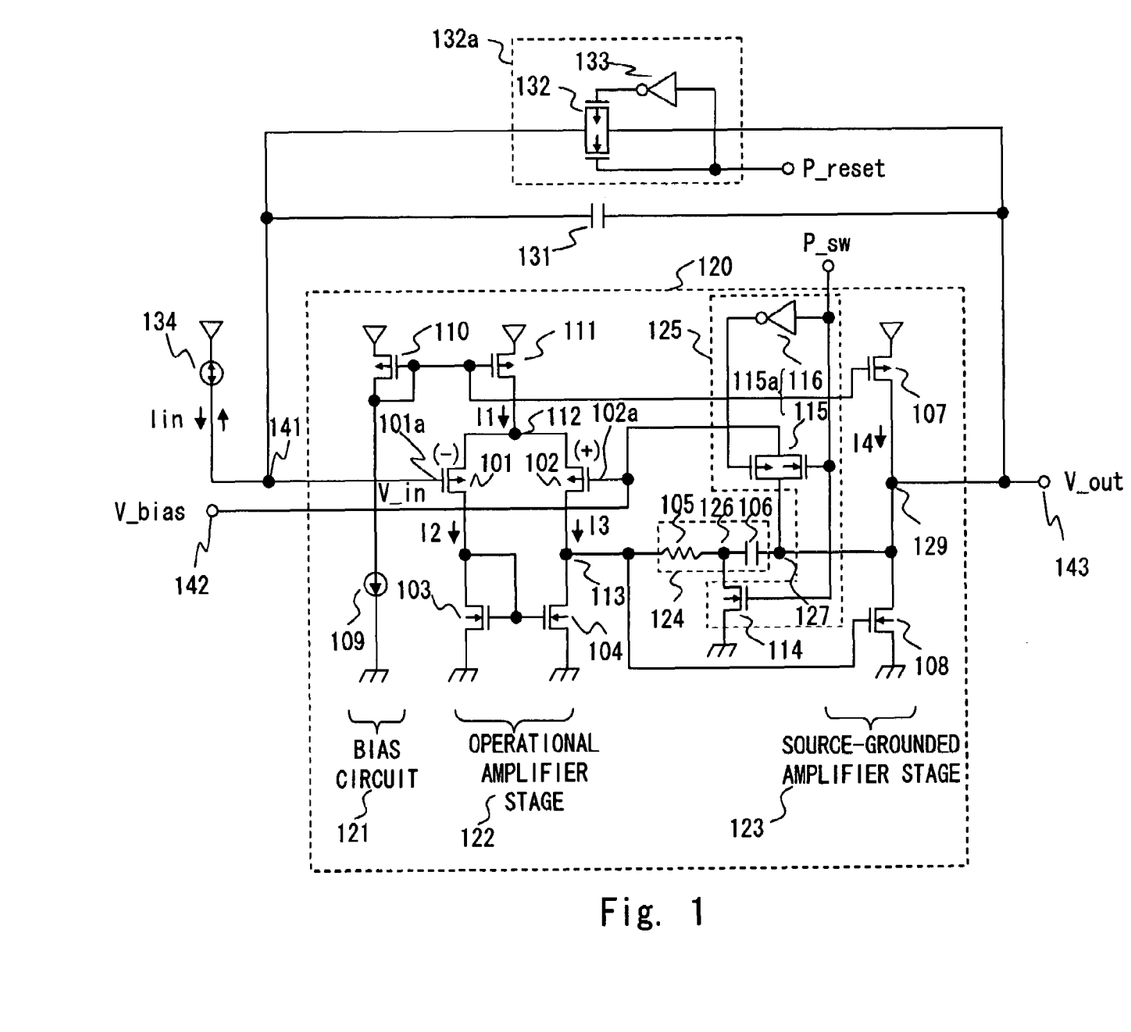
FIG. 1 is a circuit diagram showing the configuration of an integrating circuit according to a first embodiment of the present invention.

Referring to FIG. 1, the circuit configuration of the integrating circuit of this embodiment is described. The schematic configuration of the integrating circuit is the same as that of FIG. 8. That is, the integrating circuit includes an operational amplifier 120, an input current source 134, a reset switch 132a, and an integral capacitance 131.

A reference voltage V_bias (first input signal) is applied to a non-inverting input terminal (first input terminal) 142 of the operational amplifier 120, and an input current Iin (second input signal) is supplied to an inverting input terminal (second input terminal) 141 of the operational amplifier 120 from the input current source 134. In addition, an integral capacitance 131 and a reset switch 132a are connected in parallel between the inverting input terminal 141 and the output terminal 143 of the operational amplifier 120. The integral capacitance 131 is an integral element for integrating the input current Iin through charging/discharging.

The reset switch 132a is a switch for charging/discharging the integral capacitance 131 to reset the capacitance in accordance with a control signal P_reset. The control signal P_reset is a signal for turning ON/OFF the reset switch 132a to charge/discharge the integral capacitance 131 and reset the capacitance with the operational amplifier 120 in the voltage-follower connection. The reset switch 132a has a transfer gate 132 and an inverter 133. The transfer gate 132 is made up of parallel-connected N-type and P-type MOSFETs, and both ends where source terminals or drain terminals of the N-type and P-type MOSFETs are connected are connected with the integral capacitance 131. Agate of the N-type MOSFET receives the control signal P_reset, and a gate of the P-type MOSFET receives an inverted signal obtained by inverting the control signal P_reset with the inverter 133. When the control signal P_reset is at high level, the transfer gate 132 is turned ON to short-circuit both ends of the integral capacitance 131. When the control signal P_reset is at low level, the gate is turned OFF to cancel the short-circuit (open) between both ends of the integral capacitance 131.

The operational amplifier 120 includes a bias circuit 121, an operational amplifier stage 122, a source-grounded amplifier stage 123, and a phase compensation circuit 124, and includes a charge/discharge control circuit 125 in this embodiment.

The bias circuit 121 supplies a predetermined current to the operational amplifier stage 122 and the source-grounded amplifier stage 123. The bias circuit 121 includes a constant current source 109 and mirror transistor 110 connected in series between a power supply voltage VDD and a ground voltage GND. The mirror transistor 110 constitutes a current mirror circuit together with a mirror transistor 111 of the operational amplifier stage 122 and a mirror transistor 107 of the source-grounded amplifier stage 123. The mirror transistor 110 supplies a current generated with the constant current source 109 to the operational amplifier stage 122 and the source-grounded amplifier stage 123. In this example, the mirror transistor 110 is a P-type MOSFET having a source connected with the power supply voltage VDD, a gate connected with a gate of the mirror transistor 111 and a gate of the mirror transistor 107, and a drain connected with the gate and with the ground voltage GND through the constant current source 109.

The operational amplifier stage 122 is a circuit carrying out differential amplification on a signal input to the inverting input terminal 141 and a signal input to the non-inverting input terminal 142. The operational amplifier stage 122 includes the mirror transistor 111, amplifier pair transistors 101 and 102, and mirror transistors 103 and 104 between the power supply voltage VDD and the ground voltage GND.

As described above, the mirror transistor 111 constitutes a current mirror circuit together with the mirror transistor 110 to generate the current I1 and supply the generated current to the amplifier pair transistors 101 and 102. The mirror transistor 111 is a P-type MOSFET including a source connected with the power supply voltage VDD, and a drain connected with a node 112 positioned between the amplifier pair transistors 101 and 102.

The amplifier pair transistors 101 and 102 are a differential pair. The amplifier pair transistor 101 generates a current I2 in response to a signal of the inverting input terminal 141, and the amplifier pair transistor 102 generates a current I3 in response to a signal of the non-inverting input terminal 142. Both of the amplifier pair transistors 101 and 102 are P-type MOSFETs, source terminals of the amplifier pair transistors 101 and 102 are connected through the node 112. The amplifier pair transistor 101 has a gate connected with the inverting input terminal 141, and the gate serves as an inverting input node 101a. The amplifier pair transistor 102 has a gate connected with the non-inverting input terminal 142, and the gate serves as an inverting input node 102a.

The mirror transistors 103 and 104 are connected between the amplifier pair transistors 101 and 102 and the ground voltage GND. The mirror transistors 103 and 104 constitutes the current mirror circuit to mirror the current I2 generated on the inverting input node 101a side to the non-inverting input node 102a side, and generate a differential amplified signal (current I3-current I2) on the non-inverting input node 102a side. The mirror transistors 103 and 104 are both N-type MOSFETs, and gates thereof are connected with the drain of the mirror transistor 103. The mirror transistor 103 has a drain connected with a drain of the amplifier pair transistor 101 and a source connected with the ground voltage GND. The mirror transistor 104 has a drain connected with a drain of the amplifier pair transistor 102 through the node 113 and a source connected with the ground voltage GND. The node 113 serves as an output node of the amplifier pair transistor 102.

The source-grounded amplifier stage 123 is an active load type amplifying circuit, and an output circuit for amplifying a signal differential-amplified with the operational amplifier stage 122 to output the amplified signal to the output terminal 143. The source-grounded amplifier stage 123 includes a mirror transistor 107 and an output transistor 108 connected in series between the power supply voltage VDD and the ground voltage GND.

As described above, the mirror transistor 107 constitutes the current mirror circuit together with the mirror transistor 110 to generate a current I4 and supply the generated current to the output transistor 108. The mirror transistor 107 is a P-type MOSFET having a source connected with the power supply voltage VDD and a drain connected with a drain of the output transistor 108 through a node 129.

The output transistor 108 generates a signal in accordance with a voltage at the node 113 of the operational amplifier stage 122 to output an output voltage V_out from a node 129 between the transistor 108 and a mirror transistor 107 to the output terminal 143. The output transistor 108 is an N-type MOSFET having a gate connected with the node 113, and a source connected with the ground voltage GND. The output transistor 108 inversion-amplifies a voltage change at the node 113 to output the amplified voltage to the output terminal 143.

The phase compensation circuit 124 is a circuit that compensates for variations in phase of a signal output to the output terminal 143, that is, prevents oscillation. The phase compensation circuit 124 includes a phase compensation resistor 105 and a phase compensation capacitance 106 connected in series between the node 113 of the operational amplifier stage 122 (first node) and the node 129 of the source-grounded amplifier stage 123 (second node). The phase compensation circuit 124 changes a phase to prevent oscillation by use of a CR circuit composed of the phase compensation resistor 105 and the phase compensation capacitance 106. The phase compensation resistor 105 has one end connected with the node 113 and the other end connected with one end of the phase compensation capacitance 106 through a node 126 (one-end-side node). Further, the phase compensation capacitance 106 has the other end connected with the node 129 through a node 127 (other-end-side node).

The charge/discharge control circuit 125 is a circuit controlling charging/discharging of the phase compensation capacitance 106 in accordance with a control signal P_sw. The charge/discharge control circuit 125 changes a potential at both ends or one end of the phase compensation capacitance to keep a predetermined potential difference between both ends of the phase compensation capacitance 106 to charge/discharge the phase compensation capacitance 106. The control signal P_sw is a signal for turning ON/OFF the charge/discharge control circuit 125 to enable a reset operation at higher speeds than a slew rate of the operational amplifier. The charge/discharge control circuit 125 includes charge/discharge switches 114 and 115a to generate a large amount of current (high current) in accordance with a potential difference between the reference voltage V_bias and the ground voltage GND to charge/discharge the phase compensation capacitance 106 at high speeds. That is, the reference voltage V_bias and the ground voltage GND are major current sources for generating a large current to charge/discharge the phase compensation capacitance 106 at high speeds.

The charge/discharge switch 114 (second switching circuit) is a switch for setting one end of the phase compensation capacitance 106 to GND potential to cause charges to flow from the other end of phase compensation capacitance 106 to the ground voltage GND or from the ground voltage GND to the other end of the phase compensation capacitance 106. The charge/discharge switch 114 is an N-type MOSFET having a drain connected with the node 126 as one end of the phase compensation capacitance 106, a gate applied with the control signal P_sw, and a source connected with the ground voltage GND.

The charge/discharge switch 115a (first switching circuit) is a switch for setting the other end of the phase compensation capacitance 106 to a reference potential V_bias to cause charges to flow from the reference voltage V_bias to one end of the phase compensation capacitance 106 or from one end of the phase compensation capacitance 106 to the reference voltage V_bias. The charge/discharge switch 115a has a transfer gate 115 and an inverter 116. The transfer gate 115 is composed of parallel-connected N-type and P-type MOSFETs. One end of the transfer gate 115 where source terminals or drain terminals of N-type and P-type MOSFETs is connected with the non-inverting input terminal 142, and the other end thereof is connected with the node 127 as the other end of the phase compensation capacitance 106. A gate of the N-type MOSFET receives the control signal P_sw, and a gate of the P-type MOSFET receives an inverted signal obtained by inverting the control signal P_sw with the inverter 116.

When the control signal P_sw is at high level, the charge/discharge switches 114 and 115a are both turned ON to set one end of the phase compensation capacitance 106 to the ground voltage GND and set the other end to the reference voltage V_bias. When the control signal P_sw is at low level, the charge/discharge switches 114 and 115a are both turned OFF, with the result that a potential at one end of the phase compensation capacitance 106 is changed from the ground voltage GND, and a potential at the other end is changed from the reference voltage V_bias.

Figure 2:
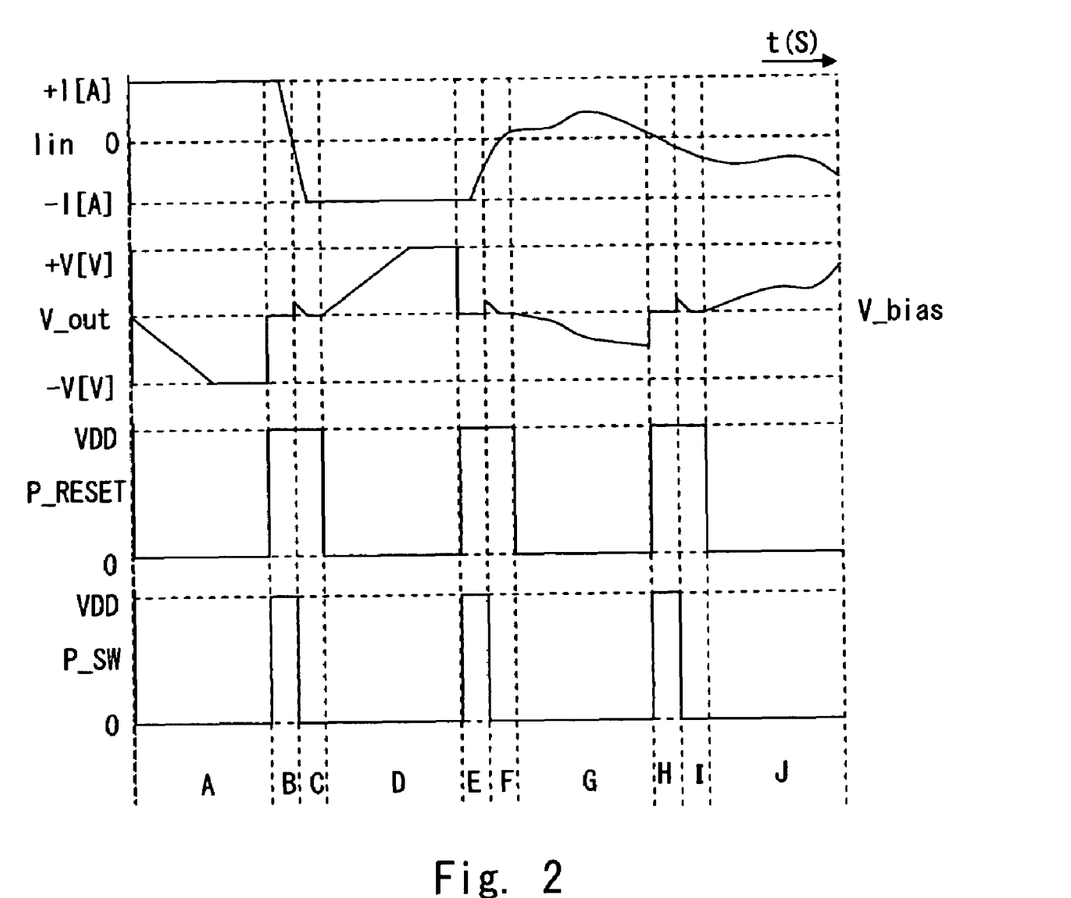
FIG. 2 is a timing chart of the integrating circuit integrating circuit of the first embodiment.

Referring next to a timing chart of FIG. 2, operations of the integrating circuit of this embodiment are described. In FIG. 2, A, D, G, and J periods are integration periods, B, E, and H periods are first reset periods, and C, F, and I periods are second reset periods.

As shown in FIG. 2, the input current Iin is an analog signal or digital signal varies between a high level (+I) and a low level (−I). A predetermined period from the rising edge of a reset signal (P_reset) that repeatedly appears at predetermined intervals corresponds to a first reset period. A predetermined period from the first reset period is a second reset period. A predetermined period from the second reset period to the next edge of a pulse corresponds to an integration period.

During the integration periods A, D, G, and J, the input current Iin is integrated by means of the integral capacitance 131. During these periods, the control signal P_reset and the control signal P_sw are at low level. Thus, the reset switch 132a, and the charge/discharge switches 114 and 115a are all turned OFF. Incidentally, the integration periods A, D, G, and J are also sampling periods for sampling the input current Iin with the integral capacitance 131.

In the integration period A, if the maximum input current Iin is supplied to a positive terminal side, the input current Iin charges the integral capacitance 131. As a result, reference voltage V_bias<<input voltage V_in, so all of the current I1 flows through the amplifier pair transistor 102 in the operational amplifier stage 122. At this time, no current I1 flows neither through the amplifier pair transistor 101, so a current does not flow through the mirror transistors 103 and 104. Accordingly, the current I1 flows from the amplifier pair transistor 102 to the phase compensation capacitance 106 through the node 113. Hence, the phase compensation capacitance 106 is discharged, and the output voltage V_out is changed from the reference voltage V_bias to a low level (−V).

In the integration period D, if the maximum input current Iin is supplied to a negative terminal side, the integral capacitance 131 is discharged in accordance with the input current Iin. As a result, reference voltage V_bias>>input voltage V_in, so all of the current I1 flows through the amplifier pair transistor 101 in the operational amplifier stage 122. Accordingly, a current flows from the phase compensation capacitance 106 to the mirror transistor 104 by means of the mirror transistors 103 and 104. Hence, the phase compensation capacitance 106 is charged, and the output voltage V_out is changed from the reference voltage V_bias to high level (+V).

In the integration periods A and D, under the condition of I4≧I1, a change rate (slew rate) of the output voltage V_out equals (current I1/phase compensation capacitance 106), and is determined based on the current I1 of the operational amplifier stage 122 and the phase compensation capacitance 106 (I4≧I1).

In the first reset periods B, E, and H, a reset operation is carried out at higher speeds than the slew rate of the operational amplifier. In these periods, the control signal P_reset and the control signal P_sw are at high level. Thus, the reset switch 132a, and the charge/discharge switches 114 and 115a are turned ON.

Since the reset switch 132a is turned ON to switch the operational amplifier 120 to the voltage follower connection for feeding the output voltage V_out of the amplifier back to the input voltage V in of the inverting input terminal 141. Further, since the charge/discharge switches 114 and 115a are turned ON to connect both ends of the phase compensation capacitance 106 to a current source.

If the reset switch 132a is turned ON, short-circuiting occurs between both ends of the integral capacitance 131. This state is such that a large amount of electrons at both ends of the integral capacitance 131 can move. Accordingly, a large current flows from a terminal on the output voltage V_out side of the integral capacitance 131 (output terminal 143) to a terminal on the input voltage V_in side of the integral capacitance 131 (inverting input terminal 141), or from the terminal on the input voltage V_in side of the integral capacitance 131 to the terminal on the output voltage V_out side of the integral capacitance 131 to thereby charge/discharge the integral capacitance 131. As a result, there is no potential difference between both ends of the integral capacitance 131.

Further, when the charge/discharge switches 114 and 115a are turned ON, the node 127 on the output voltage V_out side of the phase compensation capacitance 106 is connected with the reference voltage V_bias as a major current source, and the node 126 on the phase compensation resistor 105 side of the phase compensation capacitance 106 is connected with the ground voltage GND as a major current source. This state is such that a large amount of electrons at both ends of the phase compensation capacitance 106 can move. Accordingly, a large current flows from the reference voltage V_bias to the ground voltage GND or from the ground voltage GND to the reference voltage V_bias, and the phase compensation capacitance 106 is charged/discharged at high speeds. Then, a voltage of the node 127 is set at the reference voltage V_bias, and a voltage of the node 126 is set at the ground voltage GND.

Accordingly, in the first reset periods B, E, and H, the phase compensation capacitance 106 is charged/discharged by means of the charge/discharge switches 114 and 115a. Hence, at this time, a slew rate becomes higher than that of the operational amplifier 120.

In the second reset periods C, F, and I, a reset operation is carried out at the slew rate of the operational amplifier. In these periods, the control signal P_reset is at high level, and the control signal P_sw is at low level.

Thus, the reset switch 132a is turned ON, and the charge/discharge switches 114 and 115a are turned OFF. Since the reset switch 132a is turned ON, the operational amplifier 120 is switched to the voltage follower connection to feed the output voltage V_out of the amplifier back to the input voltage V_in of the inverting input terminal 141. The reset switch 132a is kept ON without changed from the state in the first reset periods B, E, and H. Thus, there is still no voltage difference between both ends of the integral capacitance 131.

If the charge/discharge switches 114 and 115a are turned OFF, a voltage of the node 113 as an output of the operational amplifier stage 122, which has been fixed to around the ground voltage GND during the first reset periods B, E, and H, is changed from this voltage level as the charge/discharge switch 114 is turned OFF in the second reset periods C, F, and I. As a result, the mirror transistors 103 and 104 of the operational amplifier stage 122 operate, and a voltage of the node 113 increases at high speeds. Owing to this voltage increase, a voltage across both ends of the phase compensation capacitance 106 accordingly increases at high speeds. A potential of the node 129 on one end side of the phase compensation capacitance 106 is set to the output voltage V_out, so the output voltage V_out increases at high speeds. However, the operational amplifier 120 is set to the voltage follower connection, so the voltage is changed to the reference voltage V_bias at the slew rate of the operational amplifier 120.

A voltage increase of the output voltage V_out in the second reset periods C, F, and I is determined based on a drain-source voltage of the mirror transistor 104 in the operational amplifier stage 122.

Incidentally, in the first reset periods B, E, and H, one connection end of the charge/discharge switch 114 is connected to the ground voltage GND to downscale the circuit. An ideal voltage level of the one connection end of the charge/discharge switch 114 corresponds to a voltage value of the node 113 as an output of the operational amplifier stage 122 when an input level is equal to an output level in the voltage follower connection. Accordingly, if the circuit size can be increased to some extent, a circuit for supplying or outputting a large current at an output voltage value of the operational amplifier stage 122 maybe added. At this time, in the second reset periods C, F, and I, if the charge/discharge switches 114 and 115a are turned OFF, a voltage of the node 113 is not changed, so it is unnecessary to set the second reset periods C, F, and I.

As described above, in this embodiment, in the first reset periods B, E, and H, both ends of the phase compensation capacitance 106 are connected to the major current sources by means of the charge/discharge switch, so a large current flows through the phase compensation capacitance 106, and charging/discharging can be carried out at high speeds independently of the slew rate determined in the operational amplifier 120.

Thus, a phase compensation capacitance value and a current value as a parameter for determining a slew rate of the operational amplifier can be optimized in accordance with operations in the integration period. Accordingly, it is possible to suppress an increase in current consumption in the integration period and to realize high-speed reset operations with a low-current-consumption operational amplifier.

To quantitatively express beneficial effects of this embodiment, under the condition that the slew rate of the operational amplifier is optimized in accordance with the integration period of this embodiment, if for example, integration period: reset period=10:1, power consumption of this embodiment is reduced to about ⅕ of power consumption of a conventional integrating circuit. As a ratio between the integration period and the reset period increases, an effect of reducing the power consumption is enhanced.

Second Embodiment

Next, an integrating circuit according to a second embodiment of the present invention is described. A feature of the integrating circuit of this embodiment resides in provision of an output buffer circuit and an input switch in addition to the components of the first embodiment.

Figure 3:
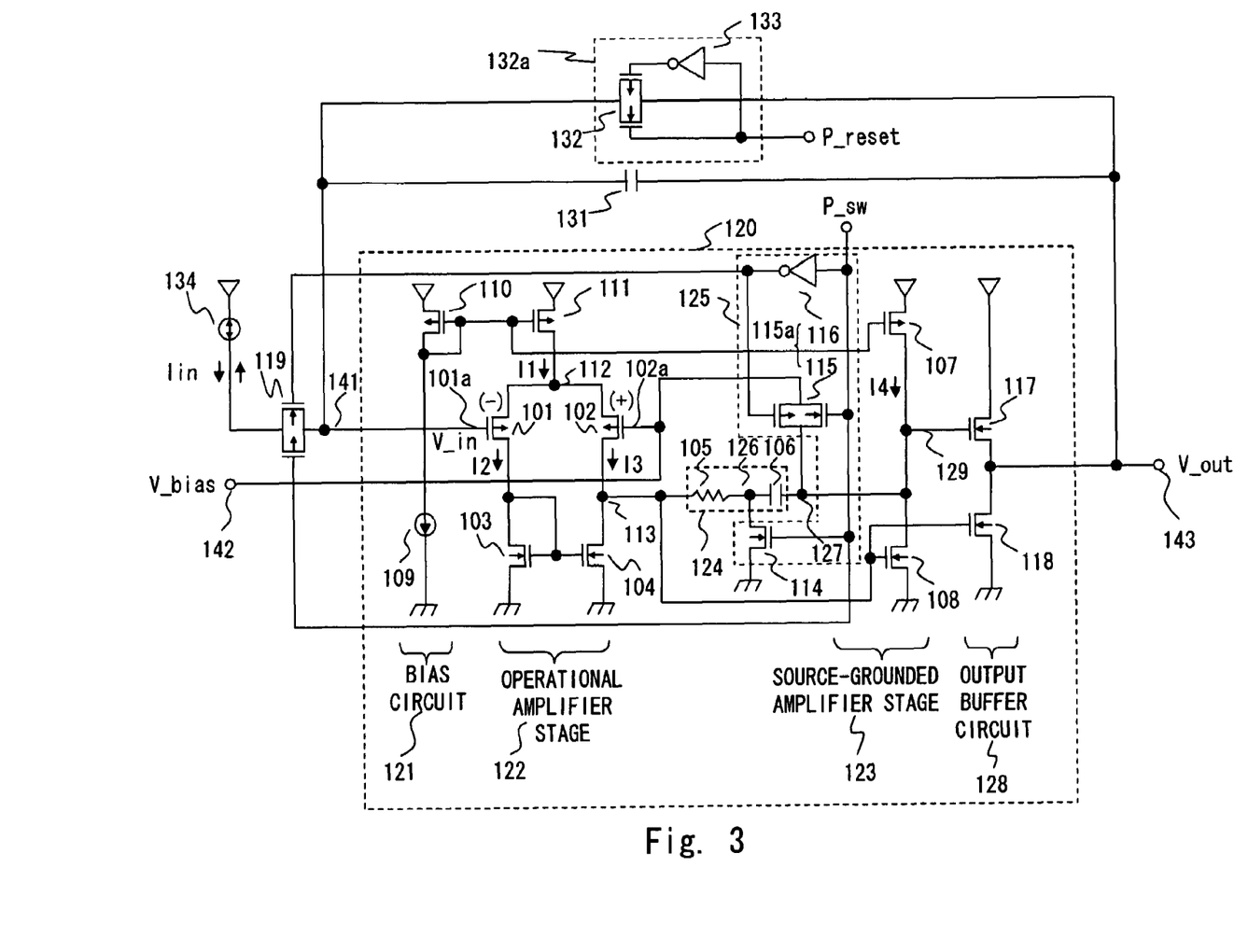
FIG. 3 is a circuit diagram showing the configuration of an integrating circuit according to a second embodiment of the present invention.

Referring to FIG. 3, the configuration of the integrating circuit of this embodiment is described. In FIG. 3, the same components as those of FIG. 1 are denoted by identical reference numerals. The integrating circuit includes an output buffer circuit 128 and an input switch 119 in addition to the components of the first embodiment as shown in FIG. 1.

In this embodiment, an output signal of the source-grounded amplifier stage 123 is sent through the output buffer circuit. That is, the output buffer circuit 128 is a circuit for further amplifying a signal amplified with the source-grounded amplifier stage 123 to send the amplified signal to the output terminal 143. The output buffer circuit 128 includes buffer transistors 117 and 118 connected in series between the power supply voltage VDD and the ground voltage GND.

The buffer transistors 117 and 118 are N-type MOSFETs. The buffer transistor 117 has a drain connected with the power supply voltage VDD, a gate connected with the node 129 of the source-grounded amplifier stage 123, and a source connected with a drain of the buffer transistor 118. The buffer transistor 118 has a gate connected with the node 113 of the operational amplifier stage 122, and a source connected with the ground voltage GND. Further, the node between the buffer transistors 117 and 118 is connected with the output terminal 143.

The input switch 119 is turned ON/OFF for connection/disconnection between the input current source 134 and the inverting input node 101a (inverting input terminal 141) of the operational amplifier stage 122 in accordance with the control signal P_sw. That is, in this embodiment, the control signal P_sw turns ON/OFF the charge/discharge control circuit 125 and the input switch 119.

The input switch 119 is a transfer gate, and is composed of N-type and P-type MOSFETs connected in parallel. One end of the switch where source terminals or drain terminals of the N-type and P-type MOSFETs are connected is connected with the input current source 134, and the other end thereof is connected with the inverting input node 101a (inverting input terminal 141). The N-type MOSFET has a gate receiving an inverted signal obtained by inverting the control signal P_sw with the inverter 116, and the P-type MOSFET has a gate receiving the control signal P_sw.

If the control signal P_sw is at low level, the input switch 119 is turned ON to establish continuity between the input current source 134 and the inverting input node 101a (inverting input terminal 141). As a result, the input current Iin is supplied. If the control signal P_sw is at high level, the input switch 119 is turned OFF, and the continuity between the inverting input terminal 141 and the inverting input node 101a is lost. Accordingly, the input switch 119 and the charge/discharge switches 114 and 115a are exclusively turned ON/OFF in contrast to each other. That is, when the input switch 119 is turned ON, the charge/discharge switches 114 and 115a are turned OFF. When the input switch 119 is turned OFF, charge/discharge switches 114 and 115a are turned ON.

If the charge/discharge switch 114 is turned ON in the first reset periods B, E, and H of FIG. 2, and a gate voltage of the buffer transistor 118 of the output buffer circuit 128 becomes the ground voltage GND, no current flows through the buffer transistor 118. As a result, the current from the input current source 134 cannot flow to anywhere, so the output voltage V_out is shifted to the power supply voltage VDD level. The input switch 119 is used for preventing such situation. The input switch 119 is turned OFF during the first reset periods B, E, and H of FIG. 2, and turned ON during the integration periods A, D, G, and J and the second reset periods C, F, and I of FIG. 2.

In this embodiment, since the output buffer circuit 128 is used in the operational amplifier 120, the phase compensation capacitance 106 is not directly applied with a load of the integral capacitance 131. Accordingly, in order to ensure a circuit stability of the operational amplifier 120, an amount of the phase compensation capacitance 106 can be reduced. How far the beneficial effect is exerted varies depending on a gate size of the buffer transistors 117 and 118, and an amount of current flowing through the output buffer circuit 128. Therefore, the phase compensation capacitance necessary for the circuit stability can become smaller than that of the first embodiment, so the slew rate can be increased.

However, in order to set a much higher slew rate, a current value of the operational amplifier stage should be increased. If so, current consumption of the operational amplifier increases. Hence, in this embodiment, similar to the first embodiment, charge/discharge switches 114 and 115a for charging/discharging the phase compensation capacitance from the outside of the operational amplifier are added, making it possible to charge/discharge the phase compensation capacitance at high speeds, and realize a high-speed reset operation with a low-current-consumption operational amplifier.

As described above, even in such a circuit that the circuit stability is ensured, the phase compensation capacitance value is set small, and the slew rate is increased, a switch for charging/discharging the phase compensation capacitance from the outside of the operational amplifier is added, with the result that the phase compensation capacitance can be charged/discharged at higher speeds than the slew rate determined in the operational amplifier.

Third Embodiment

Next, an integrating circuit according to a third embodiment of the present invention is described. The integrating circuit of this embodiment is accomplished by changing the conductivity type of the transistor in the configuration of the first embodiment.

Figure 4:
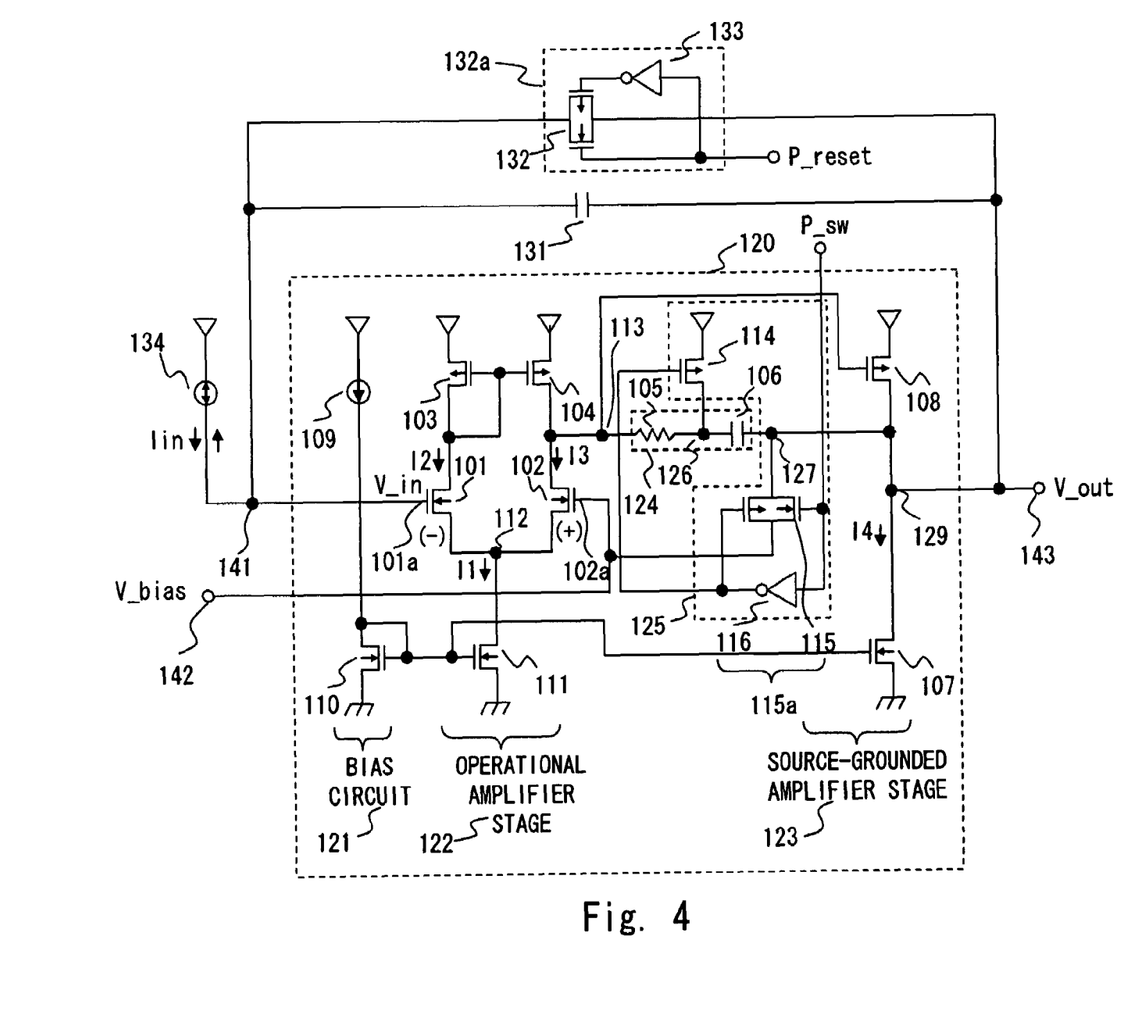
FIG. 4 is a circuit diagram showing the configuration of an integrating circuit according to a third embodiment of the p resent invention.

FIG. 4 is a circuit diagram showing the configuration of the integrating circuit of this embodiment. In FIG. 4, the same components as those of FIG. 1 are denoted by like reference numerals. In the circuit configuration of FIG. 4, the arrangement of the P-type MOSFET and the N-type MOSFET of the operational amplifier of FIG. 1 is reversed. In this example, one end of the charge/discharge switch 114 the other end of which is connected with the phase compensation capacitance 106 is connected with the power supply voltage VDD.

As described above, even if the conductivity type of the transistor is changed in the operational amplifier, its operation is completely the same as the first embodiment, and similar beneficial effects can be attained.

Fourth Embodiment

Next, an integrating circuit according to a fourth embodiment of the present invention is described. The integrating circuit of this embodiment is accomplished by changing the conductivity type of the transistor in the configuration of the second embodiment.

Figure 5:
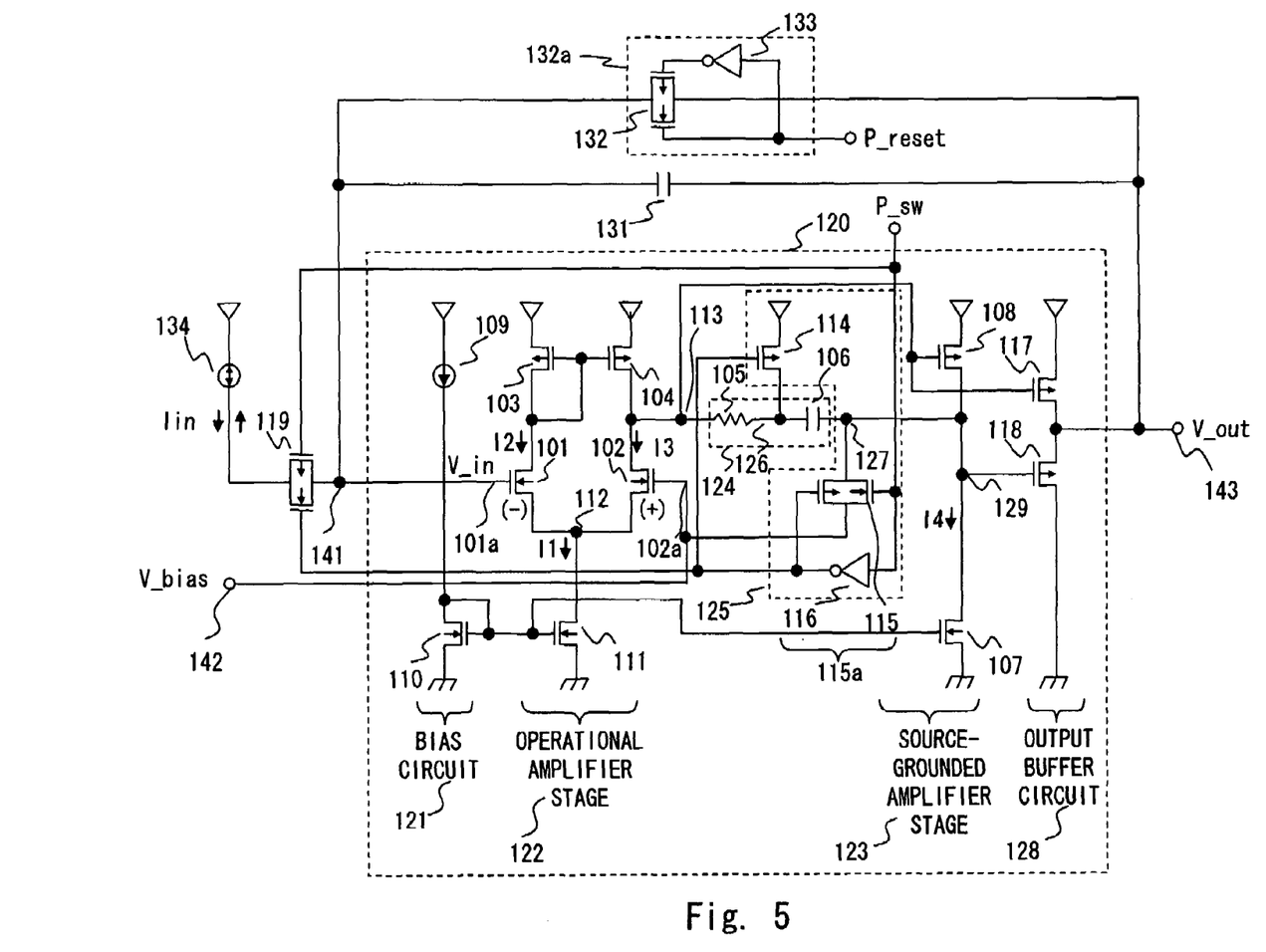
FIG. 5 is a circuit diagram showing the configuration of an integrating circuit according to a fourth embodiment of the present invention.

FIG. 5 is a circuit diagram showing the configuration of the integrating circuit of this embodiment. In FIG. 5, the same components as those of FIG. 3 are denoted by like reference numerals. In the circuit configuration, the arrangement of the P-type MOSFET and the N-type MOSFET of the operational amplifier of FIG. 3 is reversed. In this example, one end of the charge/discharge switch 114 the other end of which is connected with the phase compensation capacitance 106 is connected with the power supply voltage VDD.

As described above, even if the conductivity type of the transistor is changed in the operational amplifier, its operation is completely the same as the second embodiment, and similar beneficial effects can be attained.

Fifth Embodiment

Next, an integrating circuit according to a fifth embodiment of the present invention is described. A feature of the integrating circuit of this embodiment is that the charge/discharge switch 114 of the first embodiment is omitted.

Figure 6:
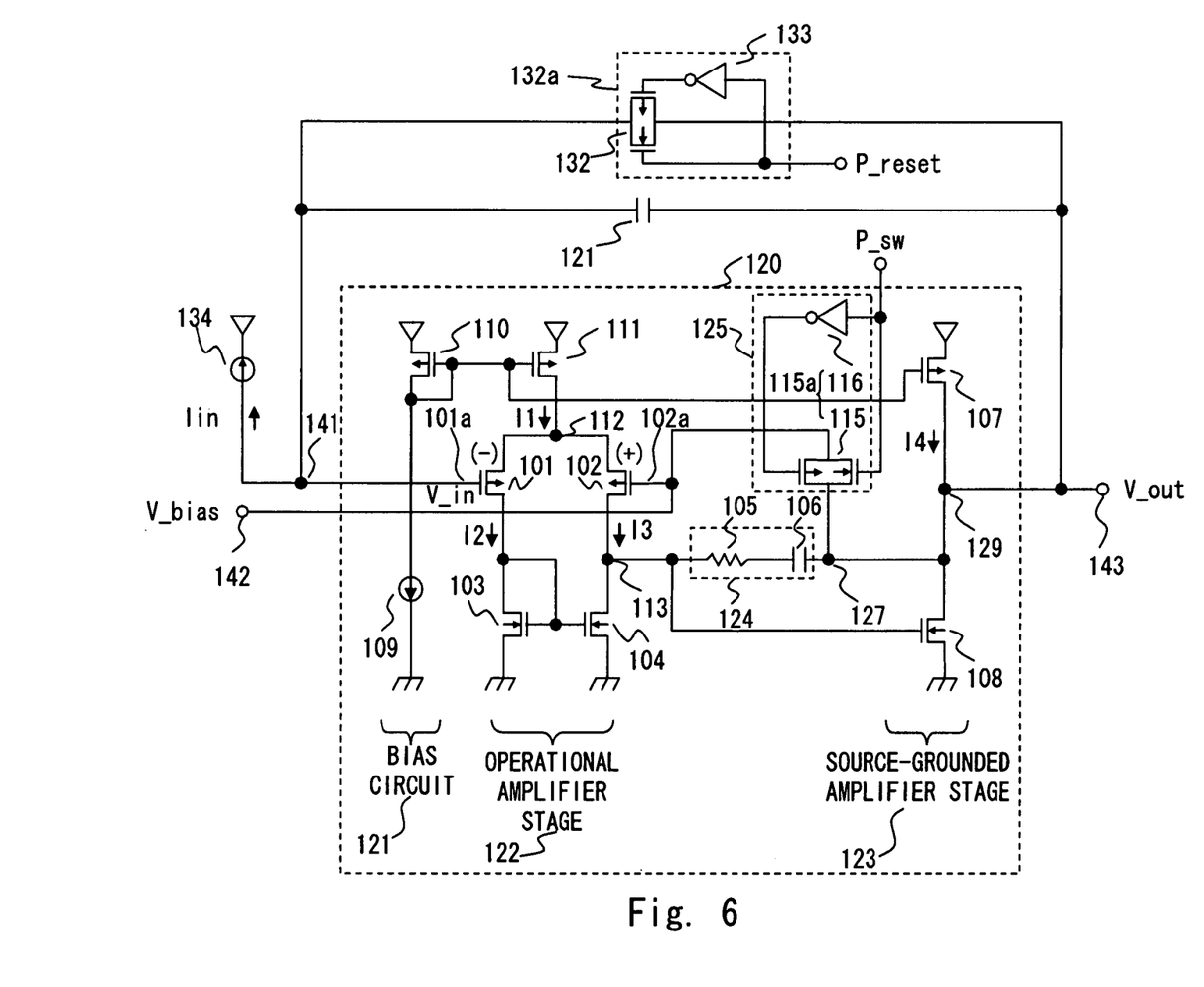
FIG. 6 is a circuit diagram showing the configuration of an integrating circuit according to a fifth embodiment of the present invention.

FIG. 6 is a circuit diagram showing the configuration of the integrating circuit of this embodiment. In FIG. 6, the same components as those of FIG. 1 are denoted by like reference numerals. The circuit configuration of FIG. 6 differs from that of the first embodiment in that the charge/discharge switch 114 connected with the node 126 of the operational amplifier of FIG. 1 is omitted, and the input current source 134 for executing the integral operations with the operational amplifier 120 can supply only a current in a reverse direction.

Since the current Iin can flow through the input current source 134 only in the reverse direction, so the output voltage V_out can only become higher than the reference voltage V_bias. This operation is explained with reference to the periods D, E, and F of FIG. 2. The operation of the first reset period E of FIG. 2 is different from the circuit operation of the first embodiment. In the first reset period E, the charge/discharge switch 115a and the reset switch 132a are turned ON. Therefore, at just the beginning of the first reset period E, a voltage across both ends of the phase compensation capacitance 106 is changed to lower by a difference between the final voltage in the integration period D of FIG. 2 and the reference voltage V_bias. As a result, if a voltage of the node 113 of the operational amplifier stage 122 is lower than a voltage value (ground voltage GND) of a back gate of the mirror transistor 104 by Vt or more, a large current flows from the back gate of the mirror transistor 104 to the phase compensation capacitance 106, and the phase compensation capacitance 106 is discharged at high speeds.

Accordingly, in this embodiment as well, similar to the other embodiments, the reset operation can be carried out independently of the slew rate of the operational amplifier 120. Incidentally, also in the second to fourth embodiments, the beneficial effects of this embodiment can be attained even though the charge/discharge switch connected between the phase compensation capacitance and the ground voltage GND or power supply voltage VDD is omitted as long as a current can flow through the input current source only in the reverse direction.

Sixth Embodiment

Next, an integrating circuit according to a sixth embodiment of the present invention is described. A feature of the integrating circuit of this embodiment is that a connecting position of the charge/discharge switch is changed in addition to the components of the first embodiment.

Figure 7:
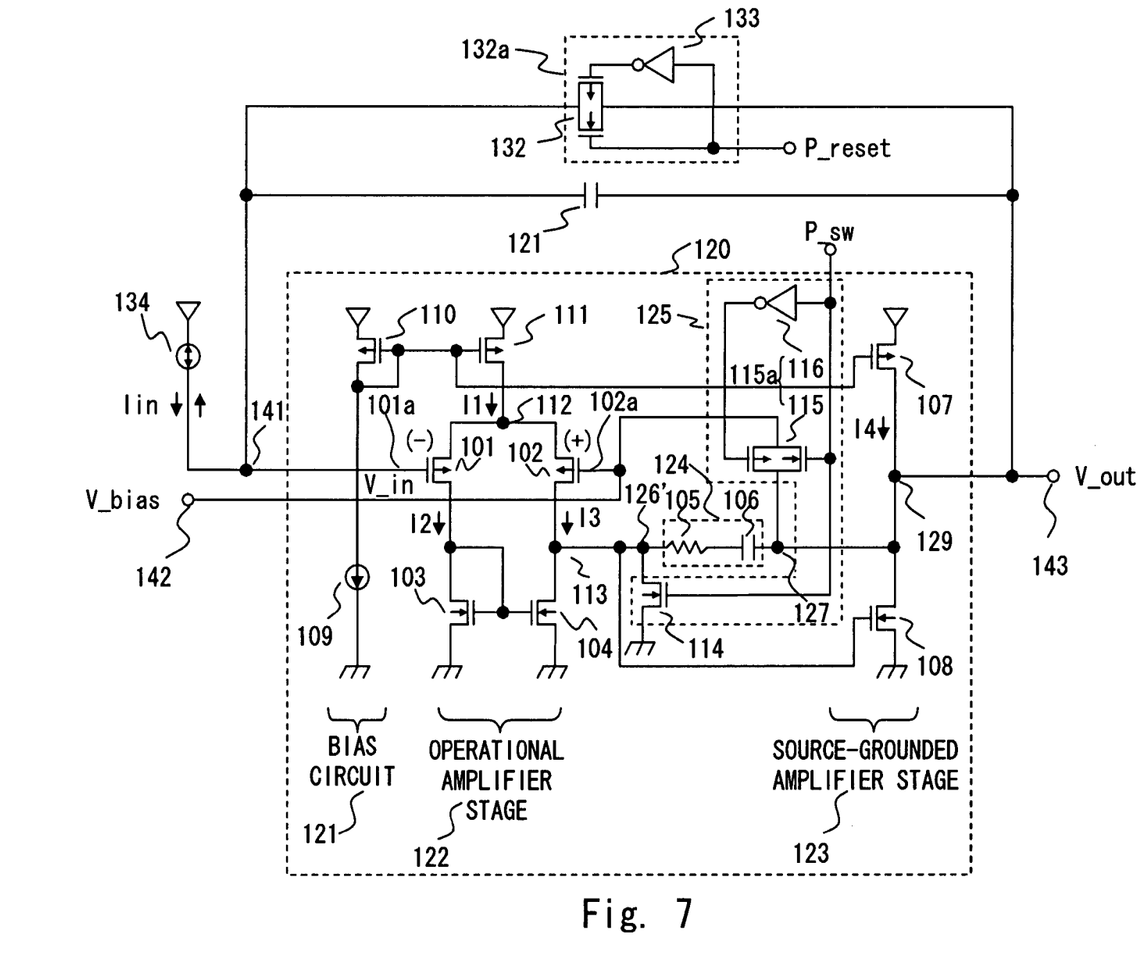
FIG. 7 is a circuit diagram showing the configuration of an integrating circuit according to a sixth embodiment of the present invention.

FIG. 7 is a circuit diagram showing the configuration of the integrating circuit of this embodiment. In FIG. 7, the same components as those of FIG. 1 are denoted by like reference numerals. The circuit configuration of FIG. 7 is different from that of FIG. 1 in that the charge/discharge switch 114 is connected with a node 126' closer to the operational amplifier stage 122 than the phase compensation resistor 105 instead of being connected with the node 126 of the operational amplifier in FIG. 1.

In the first reset periods B, E, and H of FIG. 2, a major current source is connected with one end of the phase compensation capacitance 106 on the node 126' side through the phase compensation resistor 105, so an amount of current flowing through the phase compensation capacitance 106 is limited by the phase compensation resistor 105.

Accordingly, in this embodiment, a charging/discharging speed of the phase compensation capacitance 106 becomes lower than that of the first embodiment but is higher than the slew rate of the operational amplifier 120. Incidentally, also in the second to fourth embodiments, if the charge/discharge switch is connected closer to the operational amplifier stage than the phase compensation resistor as in this embodiment, similar effects can be attained.

As another embodiment of the present invention, the aforementioned integrating circuit evaluates the integral of the input current but may evaluate the integral of the input voltage. Further, the aforementioned operational amplifier may be applied to circuits other than the integrating circuit. For example, the integrating circuit is applicable to a feedback amplifier where the integral capacitance 131 is replaced by another feedback element.

It is apparent that the present invention is not limited to the above embodiment that may be modified and changed without departing from the scope and spirit of the invention.

What is claimed is:

1. An operational amplifier comprising:
   an operational amplifier circuit differential-amplifying an input signal with reference to a reference potential;
   an output circuit outputting the differential-amplified signal;
   a phase compensation capacitance connected between an output of the operational amplifier circuit and an output of the output circuit and compensating for a phase of a signal output from the output circuit; and
   a charge/discharge control circuit controlling charge/discharge of the phase compensation capacitances,
   wherein the charge/discharge control circuit includes a first switching circuit turned ON/OFF for connection/disconnection between a node on the other end side of the phase compensation capacitance and a terminal for the reference potential.

2. The operational amplifier according to claim 1, wherein the charge/discharge control circuit changes a potential at both ends or one end of the phase compensation capacitance to cause a predetermined potential difference between both the ends of the phase compensation capacitance to charge/discharge the phase compensation capacitance.

3. The operational amplifier according to claim 2, wherein the predetermined potential difference is a difference between a power supply potential or a ground potential and the reference potential.

4. The operational amplifier according to claim 2, wherein the predetermined potential difference is a difference between an output potential of the operational amplifier circuit with the operational amplifier in voltage follower connection, and a reference potential of the operational amplifier.

5. The operational amplifier according to claim 1, wherein the node on the other end side connected with the first switching circuit is a node on an output side of the output circuit.

6. The operational amplifier according to claim 1, wherein the charge/discharge control circuit includes a second switching circuit turned ON/OFF for connection/disconnection between a node on one end side of the phase compensation capacitance and a terminal for a power supply potential or a ground potential.

7. The operational amplifier according to claim 1, wherein the charge/discharge control circuit includes a second switching circuit turned ON/OFF for connection/disconnection between a terminal applying a potential equal to an output potential of the operational amplifier circuit with the operational amplifier in voltage follower connection, and a node on one end side of the phase compensation capacitance.

8. The operational amplifier according to claim 6, wherein the node on the one end side connected with the second switching circuit is a node on an output side of the operational amplifier circuit.

9. An operational amplifier comprising:
   an operational amplifier circuit differential-amplifying an input signal with reference to a reference potential;
   an output circuit outputting the differential-amplified signal;
   a phase compensation capacitance connected between an output of the operational amplifier circuit and an output of the output circuit and compensating for a phase of a signal output from the output circuit;
   a charge/discharge control circuit controlling charge/discharge of the phase compensation capacitance; and
   a phase compensation resistor connected between the phase compensation capacitance and the operational amplifier circuit,
   wherein the charge/discharge control circuit includes a second switching circuit turned ON/OFF for connection/disconnection between a node on one end side of the phase compensation capacitance and a terminal for a power supply potential or a ground potential, and
   wherein the node on one end side connected with the second switching circuit is a node on an output side of the operational amplifier circuit and is disposed between the phase compensation capacitance and the phase compensation resistor.

10. An operational amplifier comprising:
    an operational amplifier circuit differential-amplifying an input signal with reference to a reference potential;
    an output circuit outputting the differential-amplified signal;
    a phase compensation capacitance connected between an output of the operational amplifier circuit and an output of the output circuit and compensating for a phase of a signal output from the output circuit;
    a charge/discharge control circuit controlling charge/discharge of the phase compensation capacitance; and
    a phase compensation resistor connected between the phase compensation capacitance and the operational amplifier circuit, wherein the charge/discharge control circuit includes a second switching circuit turned ON/OFF for connection/disconnection between a node on one end side of the phase compensation capacitance and a terminal for a power supply potential or a ground potential, wherein the node on one end side connected with the second switching circuit is a node on an output side of the operational amplifier circuit and is disposed between the phase compensation resistor and the operational amplifier circuit.

11. The operational amplifier according to claim 1, further comprising:

a first input terminal applying the reference potential;

a second input terminal inputting the input signal;

a buffer circuit amplifying and outputting a signal output from the output circuit;

a third switching circuit turned ON/OFF for connection/disconnection between a signal source of the input signal and the second input terminal; and a reset switch connected between the second input terminal and an output of the buffer circuit.

12. An integrating circuit, comprising:

an operational amplifier;

an integral capacitance parallel-connected with the operational amplifier; and a reset switch parallel-connected with the integral capacitance, the operational amplifier including:

an operational amplifier circuit differential-amplifying an input signal with reference to a reference potential;

an output circuit outputting the differential-amplified signal;

a phase compensation capacitance connected between an output of the operational amplifier circuit and an output of the output circuit and compensating for a phase of a signal output from the output circuit; and a charge/discharge control circuit controlling charge/discharge of the phase compensation capacitances, wherein the charge/discharge control circuit includes a first switching circuit turned ON/OFF for connection/disconnection between a node on the other end side of the phase compensation capacitance and a terminal for the reference potential.

13. The integrating circuit according to claim 12, wherein the charge/discharge control circuit changes a potential at both ends or one end of the phase compensation capacitance to cause a predetermined potential difference between both the ends of the phase compensation capacitance to charge/discharge the phase compensation capacitance.

14. A feedback amplifier, comprising:

an operational amplifier;

a feedback element parallel-connected with the operational amplifier; and a reset switch parallel-connected with the feedback element, the operational amplifier including:

an operational amplifier circuit differential-amplifying an input signal with reference to a reference potential;

an output circuit outputting the differential-amplified signal;

a phase compensation capacitance connected between an output of the operational amplifier circuit and an output of the output circuit and compensating for a phase of a signal output from the output circuit; and a charge/discharge control circuit controlling charge/discharge of the phase compensation capacitance, wherein the charge/discharge control circuit includes a first switching circuit turned ON/OFF for connection/disconnection between a node on the other end side of the phase compensation capacitance and a terminal for the reference potential.

15. The feedback amplifier according to claim 14, wherein the charge/discharge control circuit changes a potential at both ends or one end of the phase compensation capacitance to cause a predetermined potential difference between both the ends of the phase compensation capacitance to charge/discharge the phase compensation capacitance.

16. The integrating circuit according to claim 12, wherein the charge/discharge control circuit includes a second switching circuit turned ON/OFF for connection/disconnection between a node on one end side of the phase compensation capacitance and a terminal for a power supply potential or a ground potential.

17. The integrating circuit according to claim 12, wherein the charge/discharge control circuit includes a second switching circuit turned ON/OFF for connection/disconnection between a terminal applying a potential equal to an output potential of the operational amplifier circuit with the operational amplifier in voltage follower connection, and a node on one end side of the phase compensation capacitance.

18. The feedback amplifier according to claim 14, wherein the charge/discharge control circuit includes a second switching circuit turned ON/OFF for connection/disconnection between a node on one end side of the phase compensation capacitance and a terminal for a power supply potential or a ground potential.

19. The feedback amplifier according to claim 14, wherein the charge/discharge control circuit includes a second switching circuit turned ON/OFF for connection/disconnection between a terminal applying a potential equal to an output potential of the operational amplifier circuit with the operational amplifier in voltage follower connection, and a node on one end side of the phase compensation capacitance.

* * * * *